(12) United States Patent
Kreindl et al.

(10) Patent No.: US 9,323,144 B2
(45) Date of Patent: Apr. 26, 2016

(54) METHOD FOR MICROCONTACT PRINTING

(71) Applicant: EV GROUP E. THALLNER GMBH, St. Florian am Inn (AT)

(72) Inventors: Gerald Kreindl, Scharding (AT); Markus Wimplinger, Ried im Innkreis (AT); Mustapha Chouiki, Linz (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 14/439,860

(22) PCT Filed: Dec. 4, 2013

(86) PCT No.: PCT/EP2013/075562
§ 371 (c)(1),
(2) Date: Apr. 30, 2015

(87) PCT Pub. No.: WO2014/090661
PCT Pub. Date: Jun. 19, 2014

(65) Prior Publication Data
US 2015/0293442 A1 Oct. 15, 2015

(30) Foreign Application Priority Data
Dec. 10, 2012 (DE) .......................... 10 2012 112 030

(51) Int. Cl.
*B31F 1/07* (2006.01)
*G03F 7/00* (2006.01)
(Continued)

(52) U.S. Cl.
CPC ............... *G03F 7/0002* (2013.01); *B82Y 10/00* (2013.01); *B82Y 40/00* (2013.01); *G03F 7/0015* (2013.01)

(58) Field of Classification Search
CPC ........ G03F 7/0002; B82Y 10/00; B82Y 40/00
USPC ........................................................ 101/32
See application file for complete search history.

(56) References Cited

U.S. PATENT DOCUMENTS 3,165,432 A * 1/1965 Plaskett ................ B05D 1/26
156/244.21
3,678,848 A * 7/1972 Roser ..................... B41F 31/24
101/125

(Continued)

FOREIGN PATENT DOCUMENTS

DE 19949993 C1 5/2001 ............... B41C 1/00
DE 69709032 T2 5/2002 ............... B41K 1/38

(Continued)

OTHER PUBLICATIONS

Search Report issued in corresponding International Patent Application No. PCT/EP2013/075562, dated Apr. 9, 2014.

(Continued)

*Primary Examiner* — Anthony Nguyen
(74) *Attorney, Agent, or Firm* — Kusner & Jaffe

(57) ABSTRACT

A method for microcontact embossing of a structure by transferring an embossing material onto a target surface of a substrate by means of an embossing surface of a structural die. The embossing material is comprised at least predominantly of silane or at least predominantly of at least one silane derivative and in that the structural die is a soft die. A corresponding method is provided in which the embossing material is a molecular component that is comprised at least predominantly of organic molecules.

13 Claims, 2 Drawing Sheets

(51) Int. Cl.
*B82Y 10/00* (2011.01)
*B82Y 40/00* (2011.01)

(56) References Cited

U.S. PATENT DOCUMENTS

| | | | | |
|---|---|---|---|---|
| 3,709,647 | A * | 1/1973 | Barnhart | B29C 47/8815 264/555 |
| 3,954,368 | A * | 5/1976 | Kawakami | B29C 43/305 156/285 |
| 3,971,315 | A * | 7/1976 | Hansen | B41N 1/12 101/333 |
| 6,739,255 | B2 * | 5/2004 | Blees | B41K 1/52 101/103 |
| 2003/0010241 | A1 | 1/2003 | Fujihira et al. | 101/483 |
| 2003/0127002 | A1 | 7/2003 | Hougham et al. | 101/327 |
| 2008/0257187 | A1 | 10/2008 | Millward | 101/452 |
| 2010/0075108 | A1 | 3/2010 | Verschuuren | 428/156 |
| 2010/0252955 | A1 * | 10/2010 | Agarwal | B82Y 10/00 264/293 |
| 2011/0126730 | A1 | 6/2011 | Berniard et al. | 101/483 |
| 2012/0247355 | A1 * | 10/2012 | Berniard | B41K 3/28 101/250 |

FOREIGN PATENT DOCUMENTS

| | | | | |
|---|---|---|---|---|
| DE | 69730149 T2 | 12/2004 | | B05D 1/28 |
| DE | 60118843 T2 | 11/2006 | | B41K 1/02 |
| DE | 602004005888 T2 | 1/2008 | | B05D 1/28 |
| WO | WO 2008/115530 A2 | 9/2008 | | G06F 7/00 |

OTHER PUBLICATIONS

Choi et al., "A Photocurable Poly(dimethylsiloxane) Chemistry Designed for Soft Lithographis Molding and Printing in Nanometer Regime." Journal of American Chemical Society. 2003. 125: 4060-4061.
Quist et al., "Recent Advances in Microcontact Printing." Analytical Bioanalytical Chemistry Review. 2005. 381: 591-600.
Weibel et al., "Microfabrication Meets Microbiology." Nature Review Microbiology. 2007. 5:209-218.
Xia et al., "Soft Lithography." Annual Review of Material Science. 1998. 28: 153-184.
Zhang et al., "Patterning Colloidal Crystals and Nanostructure Arrays by Soft Lithography." Advanced Functional Materials Journal. 2010. 20: 3411-3424.

* cited by examiner

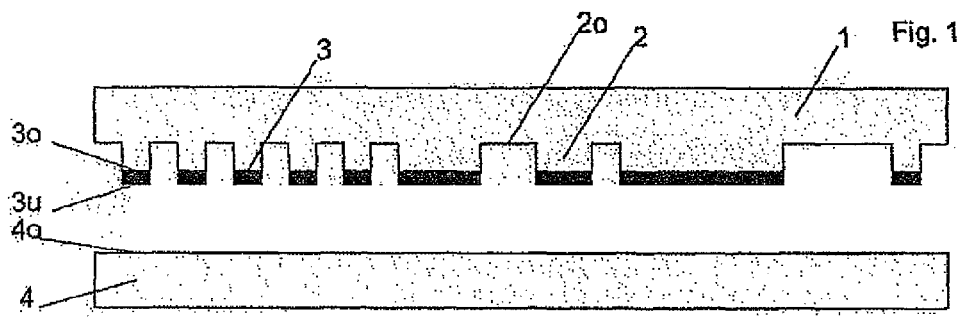
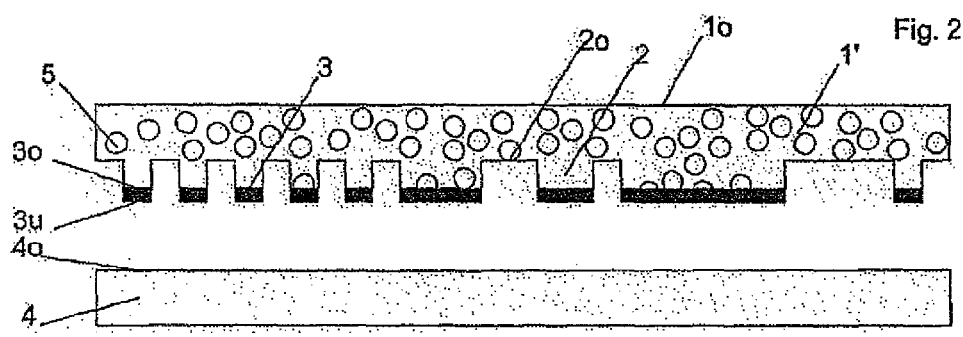
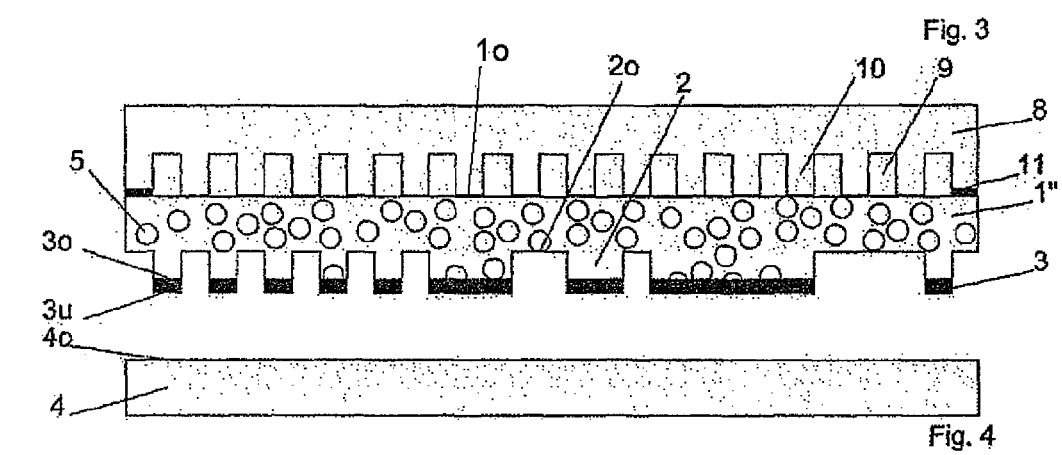
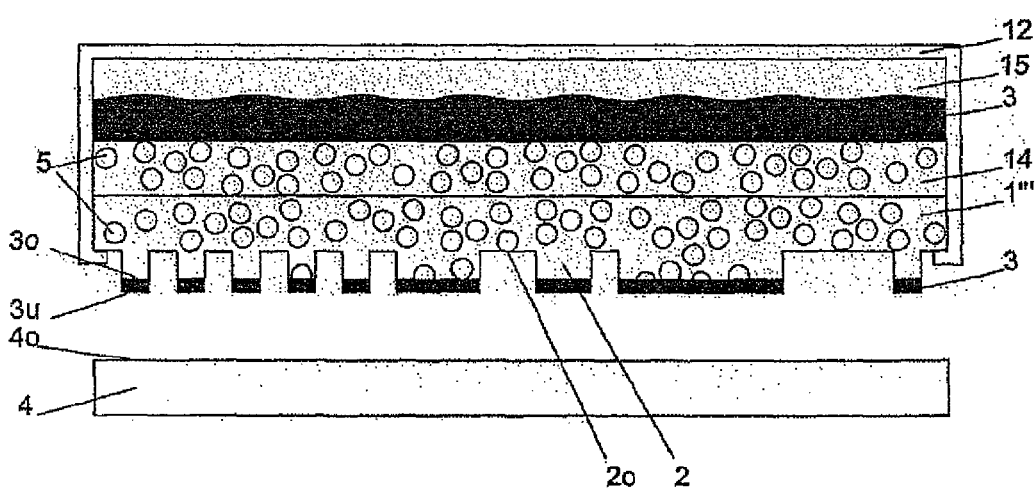

METHOD FOR MICROCONTACT PRINTING

RELATED APPLICATIONS

This application is a National Stage of International Application No. PCT/EP2013/075562 filed Dec. 4, 2013, which claims the benefit of German Patent Application No. 102012112030.7 filed Dec. 10, 2012.

FIELD OF THE INVENTION

This invention relates to a method for microcontact embossing.

BACKGROUND OF THE INVENTION

The present state of the art for microstructuring and/or nanostructuring of surfaces primarily comprises photolithography and different embossing techniques. Embossing techniques work either with hard or soft dies. In recent times, embossing lithography techniques have predominated and have eclipsed conventional photolithography techniques. Among embossing lithography techniques, primarily the use of so-called soft dies, is becoming more and more popular. The reason lies in the easy production of the dies, efficient embossing processes, very good surface properties of the respective die materials, the low costs, the reproducibility of the embossing product, and in the possibility of the elastic deformation of the die during demolding. In soft lithography, a die that is comprised of an elastomer with a microstructured or nanostructured surface is used in order to produce structures in the range of 20 nm up to >1,000 μm. Embossing lithography techniques can be roughly divided into hot embossing, nanoimprint lithography, and nanocontact or microcontact embossing. During hot embossing, the die is pressed mainly with application of force in a (heated) embossing material. In nanoimprint lithography, a very finely structured die is brought into contact with the embossing material. Although forces are also used in this method, the receiving of embossing material into nanometer- or micrometer-sized structures by capillary action is a driving force of the embossing process. With microcontact embossing, the structured die is not pressed by force into an embossing material but rather transfers a substance located on the surface of its structures onto another surface.

There are six known microcontact embossing methods:
Microcontact and/or nanocontact pressing (μ/nCP)
Replica casting (REM)
Microtransfer molding (μTM) or nanoimprint lithography (NIL),
Microforming in capillaries (MIMIC)
Solvent-supported microforms (SAMIM), and
Phase shift lithography.

Elastomer structural dies are produced as negatives of a master. A master die is a hard die made of metal or ceramic, which is produced at one time by correspondingly expensive processes. Any number of elastomer dies can then be produced from the master. The elastomer dies make possible a conformable, uniform contact across large surfaces. They are easy to separate from their rigid master die as well as from the embossing products. In addition, elastomer dies have a low surface tension for an easy and simple separation from die and substrate. The material combinations of the structural die and the embossing material cause technical problems, whereby the important factors are, i.a., a long service life or extended usability of the structural die and an exact transfer of the microstructures and/or nanostructures.

An advantage of this invention is a microcontact embossing method with which a long-lived structural die is indicated, which is suitable for an exact transfer of the microstructures and/or nanostructures to large surfaces.

This advantage is achieved with the features of the claims. Advantageous further developments of the invention are indicated in the subclaims. All combinations that comprise at least two of the features indicated in the specification, the claims and/or the figures also fall within the scope of the invention. In the indicated ranges of values, values as boundary values that lie within the above-mentioned limits are also to be considered as disclosed and can be claimed in any combination.

SUMMARY OF THE INVENTION

The invention describes a method for microcontact embossing in which at least predominantly silane or at least one silane derivative or a molecular component that at least predominantly comprised of organic molecules is used as embossing material.

The invention thus relates to a method that makes it possible to deposit material in a structured form directly onto a target surface of a substrate. In this case, the structural values shift in the lateral direction in the micrometer and/or nanometer range. The deposition process is based on bringing the surface into contact with a structured die. Embossing material that adheres to the structural die is transferred in a structured form onto the target surface. The invention also deals with the use of a structural die that consists of a suitable die material according to the invention for contact embossing of any molecular component.

A further advantageous development of the invention is based on a special die structure, which makes possible an automatic supply of material for the embossing material.

The application of the die material and/or the die structure in combination with embossing material matched to the die material on selected substrate surfaces and/or for the production of a specific group/type of end products has proven especially advantageous.

The invention makes possible the production of virtually any structured surfaces with extremely small thicknesses that are comprised of the above-mentioned components. The structures are very economically produced in large-scale production with high yield and based on the simple process run and the low number of process steps resulting therefrom, since the structural die can be used for a number of die processes and on large surfaces. When using the die structure, the embossing material supply for the embossing material is carried out in particular automatically and/or continuously, which in turn increases the output of the process and reduces the costs.

The disclosed embodiments of the structural die, in particular the die materials that are used, offer the advantage of not contaminating the embossing material as well as not altering the latter, either from the chemical standpoint or from the biological standpoint or influencing their reactivity. In this respect, the embossing materials simultaneously make possible a significantly improved production process of the die required for the contact pressure.

The invention thus also relates to a method to transfer a molecular component by a contact process from a structural die onto a target surface of a large-area, flat substrate. In special embodiments, the transfer of a molecular component also onto a structured target surface is contemplated. This primarily makes possible the use of the microcontact embossing for the creation of structured surfaces in the third dimension. In this respect, the invention is based on the idea that a structured die, which was produced from a material that is suitable according to the invention, attaches/adheres a molecular component to projections of the structure of the structural die by adhesive forces and/or diffusion into the die material and/or diffuses into a certain area in the die material. According to the invention, the molecular component is to be moved at the surface of the structures of the structural die onto a target surface. By an approach of the die to the target surface, the molecular component comes into contact with the target surface. After the contact of the target surface with the molecular component, the latter is at least partially transferred onto the target surface. This is to be understood in the sense that at least some of the molecules that adhere to the raised die structures are transferred. The mechanisms of the transfer are in this case diverse.

The transfer of a molecular component as a structure onto a target surface is referred to as contact pressure. In this respect, the dimensions of the structures that are to be transferred lie in the nanometer and/or micrometer range, by which the method is referred to more precisely as microcontact pressure, which also encompasses nanocontact pressure. The contact embossing method has the advantage of producing razor-thin structured surfaces, even up to monolayers. According to the technique, no molding of the die structure is thus performed in an embossing material, but rather a molecular component, in particular silane and/or silane derivatives, which is found at least at the projections of the die, is transferred.

In an alternative embodiment of this invention, it is provided that the molecular component has at least one or more of the structures mentioned below:
Enzymes,
Alkaloids,
Lipids,
Hormones,
Pheromones,
Vitamins,
Carbohydrates,
Peptides,
Nucleic acids,
DNA or DNA strands,
Cells,
Proteins or peptides,
Alkanes, alkenes, alkines, aromatic compounds
Graphene.

There is preferably a transfer by differences in adhesive force between the molecular component and the target surface, on the one hand, and the adhesive force between the molecular component and the die surface, on the other hand. In a preferred embodiment, the adhesive forces between the target surface and the molecular component are therefore greater than between the surface of the structured die and the molecular component. Preferably, the ratio of the above-mentioned adhesive forces is greater than 1, preferably greater than 2, more preferably greater than 5, even more preferably greater than 10, most preferably greater than 100, and with utmost preference greater than 1,000.

In another embodiment, the detachment of the molecular component from the die surface is carried out by an electric charging of the die surface. According to the invention, the electrical potential is altered by the charging of the die surface in such a way that the adhesion to the molecular component that is to be transferred is less than the adhesion of the molecular component to the target surface. An electric charging of the target surface, which alters the electrical potential in such a way that the adhesion between the molecular component and the target surface is greater than the adhesion between the molecular component and the die surface, would also be conceivable.

In another embodiment, the structural die is at least partially porous, and the detachment of the molecular component from the die surface is preferably carried out by a pressure, which is elevated relative to the environment, in the pores in the interior of the porous structural die. In this respect, the elevated pressure can be charged by any type of fluid, i.e., liquids and/or gases. Preferably, the fluid is the molecular component that is to be deposited, thus making the structural die itself a reservoir for the molecular component. The ratio between the ambient pressure and the pressure in the die is in this case greater than 1, preferably greater than 1.5, more preferably greater than 2.0, most preferably greater than 10, and with utmost preference greater than 100.

In another embodiment, the detachment of the molecular component is done via a chemical process, which selectively attacks the contact surface between the molecular component and the die surface, while the contact surface between the molecular component and the target surface is not attacked.

In another embodiment, the detachment of the molecular component is done via a thermal process by the die being heated and/or cooled to a dissolving temperature, so that the molecular component is detached from the die surface, while the adhesion to the target surface is maintained.

In another embodiment, the detachment of the molecular component is done via an electric and/or magnetic field, which weakens the contact surface between the molecular component and the die surface, while the adhesion to the target surface is maintained.

According to the invention, a combination of the disclosed transfer method of the molecular component is also possible.

In a preferred embodiment, the embossing material is fed exclusively via the die. Since a continuous material flow from the back side of the die takes place, some monolayers of the molecular component always adhere over one another. The adhesion between the molecular component and the target surface is therefore greater according to the invention than the cohesion between the individual layers of the molecular component itself. As a result, the detachment of the molecular component is carried out at least predominantly in the form of monolayers.

According to an advantageous embodiment, the die is preferably elastically deformable, i.e., a so-called "soft stamp." A soft stamp is present as soon as the die structure is produced from a soft material. The lateral stability of the soft stamp is preferably ensured by means of a carrier that is arranged, and preferably attached, behind it. The carrier is formed in particular from ceramic or metal. The elasticity is defined in general by a stiffness tensor. Since these materials exhibit homogeneous-isotropic elastic behavior in good approximation, the elastic behavior can be described by the two physical parameters of the modulus of elasticity and Poisson's number. The modulus of elasticity of the disclosed soft stamp is between $10^{-3}$ MPa and 100 MPa, preferably between $10^{-2}$ MPa and 10 MPa, more preferably between $10^{-1}$ MPa and 1 MPa, and most preferably between 0.5 MPa and 0.8 MPa.

According to the invention, the E-modulus for PFPE is in particular between 3 and 40 MPa. According to the invention, the E-modulus for PDMS is approximately 0.75 MPa.

Poisson's number is between 0.01 and 0.5, preferably between 0.1 and 0.5, more preferably between 0.2 and 0.5, and most preferably between 0.25 and 0.5.

With nanocontact and/or microcontact embossing, "soft stamps" are preferred, since the latter are able to become deformed during the transfer process and can therefore be matched to the waviness and/or roughness of the target surface. If a "hard stamp" were to be used, the die surfaces, as well as the target surfaces, would have to have an extremely slight waviness and/or roughness, which technically can be produced only with difficulty or only at considerable expense.

The structural die is therefore preferably a "soft stamp," i.e., a soft die. The die is preferably comprised of a material that is easily deformable, elastic, acid- and/or base-resistant, wear-resistant, inert, and porous and that can be produced economically. The die material is preferably a polymer. If the structural die is formed from a polymer, the latter can be hardened in particular by thermal processes and/or light irradiation. In addition, a die that is used simultaneously as a reservoir for the molecular component would be preferred. The reservoir is made possible by a corresponding porosity of the die. The open porosity of the die is in particular between 0 (i.e.: greater than 0) and 50%, preferably between 0 and 40%, more preferably between 0 and 30%, most preferably between 0 and 20%, and with utmost preference between 0 and 10%. By receiving the molecular component, the die behaves in part like a sponge. Swelling of the die results. The material transport of the molecular component can therefore take place through the die from a reservoir located behind the die or the die itself can be used as a reservoir because of its absorbency. The corresponding underlying physical phenomena of the material transport in and/or through the die are therefore the diffusion and the fundamental laws of flow dynamics. In this case, diffusion occurs as soon as when the molecular component is able to go from one side of the die to the other, or to be absorbed by one side of the die, such as by a sponge. In special cases, diffusion can also be present when the porosity of the die is low; nevertheless, the molecular component has the possibility of moving, however, based on the microstructure of the die material.

In a special embodiment, the die consists of a perfluoropolyether (PFPE).

In another special embodiment, the die consists of a polydimethylsiloxane (PDMS).

The structural die is preferably transparent in order to load the molecular component that is to be deposited through the structural die with electromagnetic radiation, in particular to start corresponding physical and/or chemical processes shortly before and/or during and/or after the transfer of embossing material onto the target surface. This applies analogously to thermal conductivity, electrical conductivity, primitivity and permeability, should the above-mentioned chemical and/or physical processes be started by heat, electric current, electric fields or magnetic fields.

According to the invention, the structural die is either a structural die that can move in space by x-y-z translation, or a roller die. A roller die is defined as a preferably seamless, structured roller that transfers its surface structure by a rotational movement onto the target surface and is suitable for the production of "continuous products."

BRIEF DESCRIPTION OF THE DRAWINGS

Additional advantages, features and details of the invention follow from the description below of embodiments that are preferred and based on the drawings; the latter in each case show in diagrammatic view:

FIG. 1 is a diagrammatic cross-sectional view of a first embodiment of this invention, FIG. 2 is a diagrammatic cross-sectional view of a second embodiment of this invention, FIG. 3 is a diagrammatic cross-sectional view of a third embodiment of this invention, FIG. 4 is a diagrammatic cross-sectional view of a fourth embodiment of this invention.

DETAILED DESCRIPTION OF THE PREFERRED EMBODIMENTS

Figure 5:
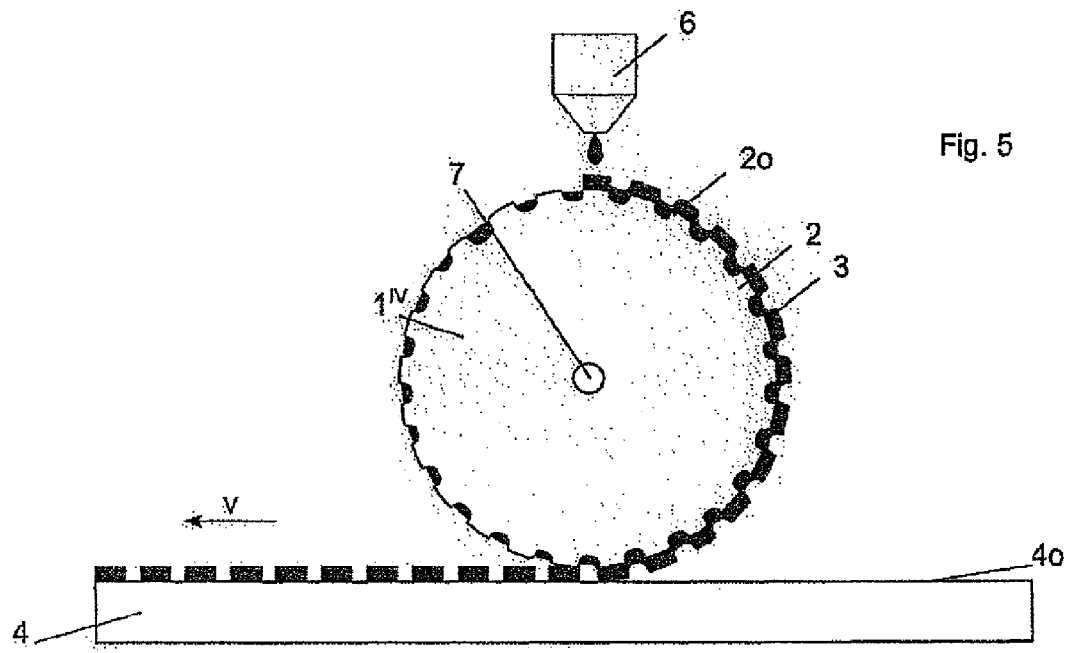
FIG. 5 is a diagrammatic cross-sectional view of a fifth embodiment of this invention.

In the figures, advantages and features of the invention are characterized with reference symbols, identified in each case, according to embodiments of the invention, whereby components or features with the same function or a function with the same effect are characterized with identical reference symbols.

In the figures, features according to the invention are not depicted to scale in order to be able to actually depict the function of the individual features. Also, the ratios of the individual components are in part disproportionate, which can be attributed in particular to structures 2 and pores 5 that are depicted greatly enlarged. The structures 2, which with this invention are embossed or are used to emboss corresponding nanostructures onto workpieces, are in the nanometer and/or micrometer range, while the order of magnitude of the machine components is in the centimeter range.

The dimensions of the individual structures 2 of an embossing surface 2o of a structural die 1 preferably are in the micrometer and/or nanometer range. The dimensions of the individual structures 2 are less than 1,000 µm, preferably less than 10 µm, more preferably less than 100 nm, even more preferably less than 10 nm, and with utmost preference less than 1 nm.

In the embodiments shown in FIGS. 1 to 4, structural dies 1, 1', 1", 1''' that are brought into contact by linear movement with a target surface 4o of a substrate 4 are shown.

Figure 6:
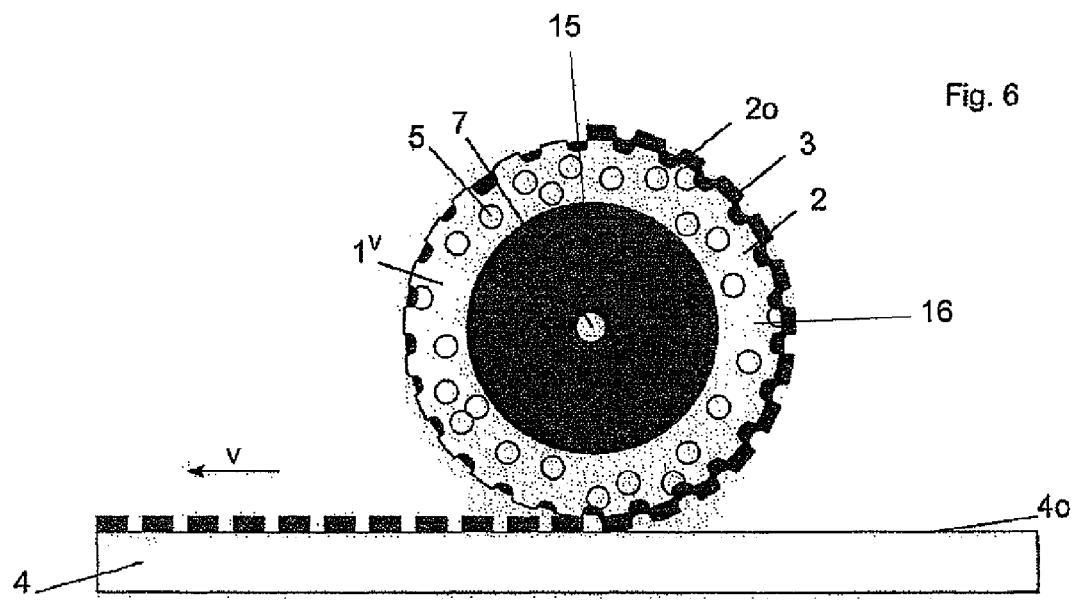
FIG. 6 is a diagrammatic cross-sectional view of a sixth embodiment of this invention.

In the embodiments shown in FIGS. 5 and 6, structural dies $1^{IV}$, $1^{V}$ are shown, which are continuously brought into contact by rotational movement around an axis of rotation 7 of the structural die $1^{IV}$, $1^{V}$ with a target surface 4o of a substrate 4 by rolling along the target surface 4o.

FIG. 1 shows a first embodiment of a structural die 1, preferably produced from PFPE, with structures 2, to whose embossing surface 2o an embossing material 3 adheres. The embossing material 3 has a first surface 3o that faces the embossing surface 2o and a second side 3u that faces a target surface 4o of the substrate 4. The embossing material 3 is applied beforehand in a coating step, not shown, by immersing the embossing surface 2o of the structures 2 in a reservoir of in particular liquid embossing material 3.

FIG. 2 shows a second embodiment of a structural die 1' that is preferably produced from PFPE and that is distinguished from the structural die 1 by its pores 5. The pores 5 have an open porosity, so that the fluid transport of the embossing material 3 from a back side 1o of the die 1' that faces away from the embossing surface 2o to the embossing surface 2o of the structures 2 can be carried out.

FIG. 3 shows a third embodiment of a structural die 1" that is preferably produced from PFPE and that is distinguished from the die 1' by a foil 8 that was attached on its back side 1o. The foil 8 has projections 10, which separate cavities 9 from one another. The cavities 9 are used for receiving the embossing material 3, which can diffuse through the die 1" and thus can go to the embossing surface 2o of the structures 2. The projections 10 can be in particular columns or dies (pillars) or drawn-out walls that run across the entire width. The projections 10 are used predominantly for supporting the die 1". The foil 8 has a thickness of between 100 and 2,000 μm. The height of the cavities 9 or the height of the projections 10 is between 100 μm and 500 μm. The die 1" is preferably connected to a side periphery 11 of the foil 8. In this connection, it can be a bonding, a welding or a type of connection that is preferably permanent in some other way.

FIG. 4 shows a fourth embodiment of a die 1''', which is mounted on a carrier 14, which is preferably also porous. The carrier 14 is preferably comprised of a ceramic or a metal or a high-strength and hard polymer. The die 1''' and the carrier 14 are surrounded by a shield 12. The embossing material 3 can be stored in a cavity 15 via the carrier 14. The diffusion of the embossing material 3 by the support plate 14 and the die 1''' is accordingly carried out as in the other above-mentioned embodiments. The carrier 14 can be connected to the die 1''' by the material of the die 1''' being moved into the porous structure of the carrier 14 or is squeezed through during the production process of the connection. Since the material of the die 1''' is preferably very soft, the die 1''' can be produced, for example, on the carrier 14. During the production process, the highly viscous but always still liquid embossing material 3, from which the die 1''' is produced, can already partially penetrate into the pores 5 of the carrier 14 and thus produces a connection between two elements. After the hardening of the embossing material 3 of the die 1'', the latter is tightly connected to the die 14. According to the invention, the carrier 14 and the die 1''' need not be connected to one another, however, but rather can also be pressed on one another or at least held together only by the shield 12 or any other device.

FIG. 5 shows a fifth embodiment of a structural die $1^{IV}$ in the shape of a roller that is preferably produced from PFPE and that can be viewed as a round die. A dispenser 6 provides a continuous and long-lasting wetting of the embossing surface 2o of the structures 2 with the embossing material 3. The transfer of the embossing material 3 onto the target surface 4o is carried out by a corresponding relative movement of a substrate 4 to the structural die $1^{IV}$. In the most preferred embodiment, the structural die $1^{IV}$ is mounted to rotate around a rotational axis 7, while the substrate 4 is moved in a translatory or tangential manner to the roller at a speed V.

FIG. 6 shows a sixth embodiment, according to the invention, of a structural die $1^{IV}$ in the form of a roller that is preferably produced from PFPE and that can be viewed as a round die. The structural die $1^V$ is produced as a hollow shaft 16. A cavity 15 in the interior of the hollow shaft 16 is used as a reservoir for the embossing material 3. The structural die $1^V$ has a porous microstructure that is comprised of pores 5 and that makes possible the passage of the embossing material 3 from the cavity 15 to the surface 2o of the structures 2. The transfer of the embossing material 3 onto the target surface 4o is carried out by a movement of a substrate 4 relative to the roller corresponding to the fifth embodiment.

LIST OF REFERENCE SYMBOLS 1, 1', 1", 1''', Structural die
$1^{IV}$, $1^V$ Structural die
1o Back side
2 Structures
2o Embossing surface
3 Embossing material
3o First side
3u Second side
4 Substrate
4o Target surface
5 Pores
6 Dispenser
7 Axis of rotation
8 Foil
9 Cavities
10 Projections
11 Side periphery
12 Shield
14 Carrier
15 Cavity
V Speed Having described the invention, the following is claimed:

1. A method for microcontact embossing a structure on a target surface of a substrate, the method comprising:
   transferring an embossing material onto the target surface by means of an embossing surface of a structural die to emboss the structure on the target surface, the embossing material selected from the group consisting of silane, at least one silane derivative, and a molecular component of organic molecules, the structural die being a soft die and formed in a shape of a roller as a hollow shaft, the hollow shaft having a cavity in an interior thereof that is used as a reservoir for the embossing material, the structural die having a porous microstructure that consists of pores, the pores being arranged to pass the embossing material from the cavity to the embossing surface.

2. The method according to claim 1, wherein the organic molecules are one or more selected from the group consisting of Enzymes, Alkaloids, Lipids, Hormones, Pheromones, Vitamins, Carbohydrates, Peptides, Nucleic acids, DNA or DNA strands, Cells, Proteins, Alkanes, Alkenes, Alkines, Aromatic compounds, and Graphene.

3. The method according to claim 1, wherein the structural die has a modulus of elasticity between $10^{-3}$ MPa and 100 MPa.

4. The method according to claim 1, wherein the structural die is acid-resistant and/or base-resistant.

5. The method according to claim 1, wherein the structural die consists essentially of an inert material.

6. Method-The method according to claim 1, wherein the structural die is formed from a polymer, in particular PFPE or PDMS.

7. A method for embossing a structure onto a substrate, comprising the steps of:
   providing a hollow cylindrical structural die having a soft, outer embossing surface arranged to emboss said structure onto a target surface of said substrate, said structural die having an inner cavity arranged to hold an embossing material, said structural die further having a porous microstructure having pores dimensioned to allow passage of said embossing material from said cavity to said embossing surface;
   positioning said structural die against said target surface; and
   embossing said structure formed of said embossing material onto said target surface, said embossing material being selected from the group consisting of a silane, a silane derivative, and a molecular component of organic molecules, said embossing comprising moving said substrate relative to said structural die such that said embossing surface travels over said target surface and forms said structure on said target surface.

8. A method of embossing a structure onto a substrate with an embossing surface formed on an outer surface of a soft roller die, the die having a rotational axis and a hollow shaft in which a cavity containing embossing material is arranged, said embossing material being selected from the group consisting of silane, at least one silane derivative, and a molecular component of organic compounds, the die further comprising a porous microstructure comprising pores dimensioned to permit diffusion of the embossing material supplied to the cavity when required by the embossing surface, the method comprising:
- contacting the embossing surface to the target surface; and
- embossing said structure on said target surface with said embossing material according to said embossing surface, said embossing comprising:
  - moving said substrate relative to said die to rotate said embossing surface around said rotational axis; and
  - transferring said embossing material from said embossing surface to said target surface by said moving of said substrate.

9. The method according to claim 8, wherein the roller die consists of an inert material.

10. The method according to claim 8, wherein the roller die is formed of PFPE.

11. The method according to claim 8, wherein the roller die is formed of PDMS.

12. The method according to claim 8, wherein the porous microstructure consists essentially of said pores.

13. The method according to claim 8, wherein the passing of the embossing material from the cavity to the embossing surface is dependent on the ability of the embossing surface to absorb the embossing material.

* * * * *